United States Patent [19]

Bulst et al.

[11] 4,325,037
[45] Apr. 13, 1982

[54] ACOUSTIC WAVE FILTER

[75] Inventors: Wolf E. Bulst, Vaterstetten; Hans Eschler, Berlin, both of Fed. Rep. of Germany

[73] Assignee: Siemens Aktiengesellschaft, Berlin & Munich, Fed. Rep. of Germany

[21] Appl. No.: 127,814

[22] Filed: Mar. 6, 1980

[30] Foreign Application Priority Data

Mar. 12, 1979 [DE] Fed. Rep. of Germany ....... 2909705

[51] Int. Cl.³ .......................... H03H 9/64; H03H 9/25
[52] U.S. Cl. .................................... 333/194; 333/195; 333/196
[58] Field of Search ................................. 333/193–196, 333/150–155; 310/313 R, 313 A, 313 B, 313 C, 313 D; 331/107 A; 330/3.5; 358/905, DIG. 1

[56] References Cited

U.S. PATENT DOCUMENTS 3,582,838 6/1971 De Vries .............................. 333/194

OTHER PUBLICATIONS

Crabb et al., "Surface-Acoustic-Wave Oscillators: Mode Selection and Frequency Modulation", Electronics Letters, May 17, 1973, vol. 9, No. 10, pp. 195–197.

Primary Examiner—Marvin L. Nussbaum
Attorney, Agent, or Firm—Hill, Van Santen, Steadman, Chiara & Simpson

[57] ABSTRACT

An acoustic wave filter comprising a piezoelectric substrate body upon which at least two digital structures are formed and which comprise input and output transducers and form a selective wave reflective pair with at least one of the digital structures having a wide band amplitude characteristic F1 and at least one of the other digital structures having a narrower frequency band amplitude characteristic and wherein the center frequency f1 of the wider band F1 digital structure is displaced relative to the center frequency f2 of the digital structure which has a narrower frequency band F2 by a frequency of $\Delta_f$ on either side of the center frequency f1 so that one of the zero locations $f_{R1'2}$ of the distortion signal $F_R$ of interdigital reflections is placed close to the value of the center frequency $f_0$ of the filter.

12 Claims, 4 Drawing Figures

ACOUSTIC WAVE FILTER

BACKGROUND OF THE INVENTION

1. Field of the Invention

This invention relates in general to acoustic surface wave filters which comprises a transit time delay arrangement for a wave passing in one direction in the filter or can also comprise a resonator with an acoustic wave standing in the resonator and the invention can be applied to either of these two different filter arrangements.

2. Description of the Prior Art

The publication "Electronics Letters", Volume 9, (1973), Pages 195-197 illustrates in FIG. 2 a 98 MHz oscillator which utilizes a filter of the type to which this invention relates. This filter utilizes a relatively wide band interdigital structure which has a length of r·λ and an interdigital structure which has a narrow band which has a length of p·λ. The narrow band interdigital structure is not completely filled over its length with digital strips or fingers as this would not be necessary for the narrow band condition but this elimination of certain of the fingers increases the insertion loss of the filter. Both of the interdigital structures of the prior art have the same predetermined mean or center frequency $f_0$. The reason for not completely filling out a converter or transducer interdigital structure with digital strips, is to decrease the signal interferences (distortion signal through reflections to an interdigital structure of the filter. Such reflections are caused, for example, by waves which pass from the narrow band structure having a length of p·λ in the reverse direction due to reflection which waves impinge upon the wide band structure having a length r·λ and are reflected to the digital strips of such structure again and then proceed as time delay signals to the narrow band structure. A signal thus occurring at the narrow band structure is designated as a "triple transit" signal. The occurrence of such interfering or distortion signals causes a so-called "ripple" in the amplitude and frequency response $F_0; \phi_0$ of the filter.

In addition to the use of digital structures in which some of the fingers are missing, other methods have been proposed so as to more or less suppress the triple transit signal occurring because of the undesired multiple reflections caused by the interdigital structures. For example, the digital strips have been divided in one structure into two parallel strips connected with one another electrically with in each case having fingers which are only half as large as the width of the conventional fingers. Since, however, the maximum admissable width of a digital strip or finger is determined by the desirable frequency or particularly the mean frequency $f_0$ of the filter, the use of "split fingers" results in extreme requirements with respect to the manufacture of extremely narrow digital strips and also decreases the maximum useable frequency by a factor of 2 in a filter so constructed.

SUMMARY OF THE INVENTION

It is an object of the present invention to provide for suppression of signals which are based on reflections in interdigital structures of filters such as triple transit signals which can be realized without additional technical difficulties and which allow the high maximum frequency of the filter to be unchanged which could not be attained with split fingers.

In addition to the advantages attained with respect to the upper frequency of the filter, the invention allows low insertion loss with an interdigital structure which can be filled out with a larger quantity of digital strips without having the interfering signal occur.

The invention utilizes the feature that the amplitude characteristic or response $F_R$ of the triple transit interfering signal which is based upon among other things interdigital reflections by the wider band digital structure has two zero locations at frequencies $f_{R1}$ and $f_{R2}$ next below and above its center frequency which is the maximum of the frequency response F. These zero frequency locations $f_{R1}$ and $f_{R2}$ lie within the main lobe or maximum of the amplitude characteristic or response $F_1$ of the wider band interdigital converter or transducer structure and in the invention the main or center frequency $f_1$ of the digital structure with a wider band amplitude characteristic $F_1$ is shifted by a frequency $\Delta f$ relative to the pregiven mean or center frequency $f_0$ and, thus, to shift it with respect to the mean or center frequency $f_2$ of the narrower band digital structure such that one of these two zero locations $f_{R1}$ or $f_{R2}$ which are related to the mean or center frequency $f_1$ of the wider band structure coincides substantially with the frequency $f_0$ of the filter. Because the band width of the narrower band width structure is smaller then the wider band width structure by a factor of at least two or preferably at least five, it will be assured that the interfering signal frequency $F_R$ will at most have only a smaller amplitude portion which falls into the pass band $F_0$ of the filter according to the invention.

The invention can be utilized as a filter comprising a narrow band transit time delay line or, alternatively, the invention can be utilized as a filter comprising a resonator according to the invention.

Other objects, features and advantages of the invention will be readily apparent from the following description of certain preferred embodiments thereof taken in conjunction with the accompanying drawings although variations and modifications may be affected without departing from the spirit and scope of the novel concepts of the disclosure and in which

DESCRIPTION OF THE PREFERRED EMBODIMENTS

Figure 1:
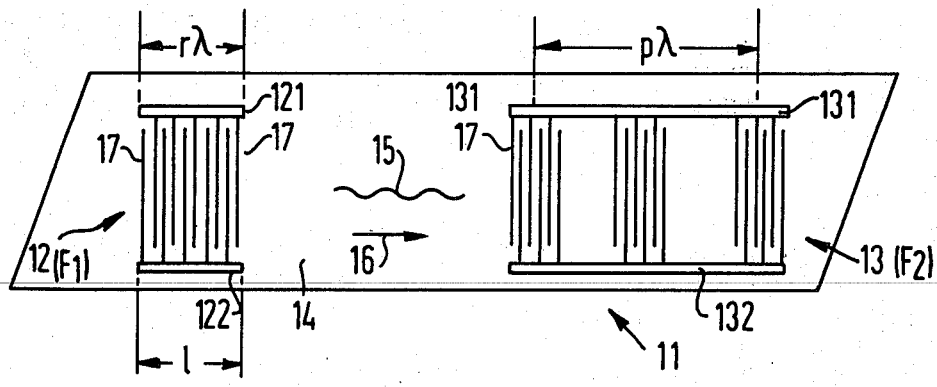
FIG. 1 comprises a top plan view of a filter according to the invention in the form of a transit time delay line.
Figure 4:
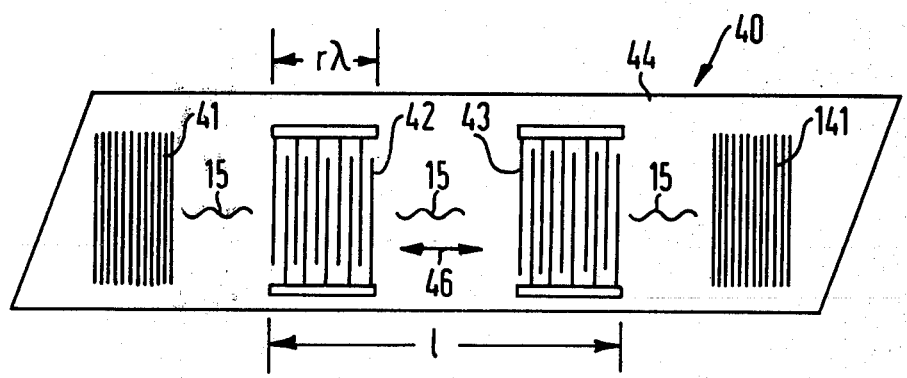
FIG. 4 comprises a plan view illustrating an embodiment of the filter wherein the invention is utilized as a resonator.

FIG. 1 illustrates a design of the invention as a transit time delay line designated generally as 11 which comprises a piezoelectric substrate body 14 made of, for example, quartz or lithium niobate. A first interdigital structure 12 as, for example, an input converter is mounted on the substrate body 14 and a second interdigital structure 13 which may be an output converter is mounted on the substrate 14. The interdigital structure 13 has a geometric length of p·λ, and, thus, it has a relatively narrow frequency band width and a narrow frequency band width characteristic $F_2$ with a mean frequency of $f_2$. The individually represented digital strips or fingers of the interdigital structures 12 and 13 are represented in FIGS. 1 and 4 as lines. The actual practice, they would have a width of, for example, 2 μm, for a maximum frequency of approximately 500 MHz. The lengths of the individual digital strips 17 is adjusted depending upon the signal power which is to be transmitted and in a specific example, the lengths can be 1 mm. The digital strips in the interdigital structures 12 and 13 are respectively alternatingly connected with ridges 121 and 122 in structure 12 and ridges 131 and 132 in structure 13.

FIG. 1 only shows those details of the embodiment of a filter which are essential for the invention and such additional details such as connection lines which would be connected to the connection ridges 121 and 122, 131 and 132 are not shown. Neither are the acoustics sumps which would be applied to the end of the substrate are illustrated. If it be assumed that the digital structure 12 is an input converter then the acoustic surface wave which is generated piezoelectrically within structure 12 in the substrate body 14 which is indicated by the wavy line 15 will travel in the direction of the arrow 16 into the vicinity of the structure 13 of the output converter and will there be converted back from piezoelectric energy into an electrical signal wave.

Figure 2:
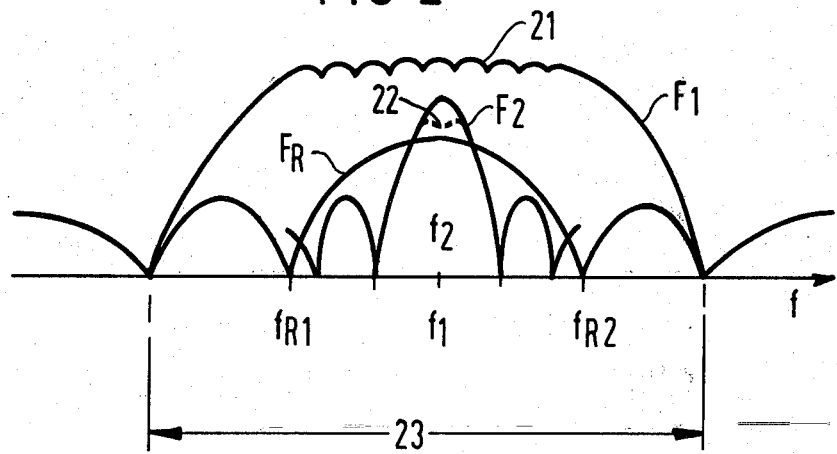
FIG. 2 comprises a plot of the amplitude characteristic for a filter formed according to the prior art.

FIG. 2 is a diagram illustrating frequency as the abscissa and the amplitude is plotted as the ordinate. The amplitude characteristics are plotted with the amplitude characteristic $F_1$ for the relatively wide band interdigital structure 12. The amplitude characteristic $F_R$ is the characteristic of the signal of the interdigital reflections from the wider band width interdigital structure 12 (triple transit signal; TTS). The relationship of the amplitude characteristics $F_1$ and $F_2$ to each other according to FIG. 2 is the same in prior art devices wherein the mean frequency $f_2$ of the narrow band structure 13 lies generally at the mean frequency $f_1$ of the wide band structure. The total amplitude characteristic resulting corresponds due to the multiplication of the two amplitude characteristics $F_1$ and $F_2$ with each other with the precision which is necessary for observation and within the main maximum of the amplitude characteristic $F_1$ is shown in FIG. 2. The mean frequency $f_0$ of the entire filter 11 comprises the mean frequency $f_2$ of the amplitude $F_2$. The wavy portion 21 of the upper part of curve $F_1$ results because of the superposition of the signal $F_R$ of the interdigital reflections (TTS signal). This waviness is designated as "ripple". The total amplitude characteristic $F_0$ of the filter has an interfering characteristic indicated by the dotted lines 22 in the amplitude characteristic $F_2$. In a corresponding manner, the phase relationship curve of the filter over the frequency band will indicate interference in the phase characteristic.

It has been determined for the amplitude characteristic $F_R$ of the signal caused by the interdigital reflections and supplied to the interdigital structure 12 plotted here in an isolated manner results in the curve designated by $F_R$. The first two minima $f_{R1}$ and $f_{R2}$ fall within the main maximum 23 of the amplitude characteristic $F_1$ of the wider band structure 12. As shown, the zero locations $f_{R1}$ and $f_{R2}$ fall in each case at the half-way spacing between the main frequency $f_1$ and the points where the characteristic $F_1$ reaches zero. It has been observed that the amplitude characteristic $F_1$ of the wider band structure 12 in the case of these frequency values $f_{R1}$ and $f_{R2}$ does not have any significant drop compared to the bandwidth of the amplitude characteristic $F_2$ of the narrower band structure 13 in the relevant cases of the invention where the band width ratio of $F_1:F_2$ is at least 2:1 and desirably more than 5:1.

Figure 3:
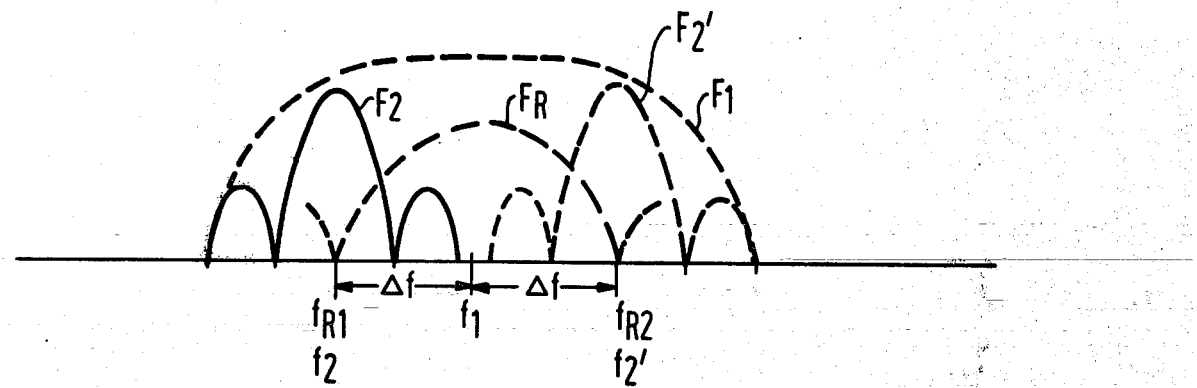
FIG. 3 comprises a plot of the amplitude characteristics of a filter with dimensions selected according to the invention.

FIG. 3 is a frequency characteristic curve which illustrates the basis of the invention. $F_R$ in FIG. 3 illustrates the amplitude characteristic of the signal of the interdigital reflections supplied to the wider band structure and has zero locations at $f_{R1}$ and $f_{R2}$. The amplitude characteristic $F_1$ does not have the waviness or ripple 21 of the prior art curve illustrated in FIG. 2 because it has been eliminated with the invention. In the present invention, the amplitude characteristic $F_2$ of the narrower band structure 13 is displaced by a frequency displacement of $\Delta f$ from the mean frequency $f_1$ so that its mean frequency $f_2$ occurs at the frequency $f_{R1}$. The distance $\Delta f$ is one half the distance from $f_1$ to a zero of $F_1$. An equivalent solution shown by the broken line curve of the amplitude characteristic $F_2$, has a mean frequency $f_2$, falling at $f_{R2}$. Since for both solutions the zero locations of $F_R$ coincide with the mean frequency $f_2$ and $f_{2'}$ of the narrow band structure and the amplitude characteristic $F_1$ does not have any substantial amplitude drop over the width of the main maximum of the amplitude characteristic $f_2$ of the narrower band structure 13 and there will no longer occur in the total amplitude characteristic $F_0$ due to the frequency offset $\Delta f$ the amplitude interference which existed in the prior art structure such as shown in FIG. 2 and particularly in the maximum of the amplitude characteristic $F_2$ indicated by dotted line 22 in FIG. 2.

The amplitude characteristic $F_0$ corresponds for the main maximum to the quantitative curve of the amplitude characteristic $F_2$ of the narrower band structure 13. Because the curve of the amplitude characteristic $F_1$ is unsymmetrical with the mean frequency $f_2$, the submaxima due not result in unsymmetrical attenuation.

The result of the invention is that a reflection of an acoustic wave which occurs from the narower band width structure 13 to the wider band structure 12 will be substantially suppressed and thus there will be no interfering triple transit signal.

FIG. 4 illustrates an embodiment of the invention formed as a resonator 40 which has a piezoelectric substrate body 44 upon which at opposite ends the digital structures 41 and 141 are mounted. Also, the interdigital structures 42 and 43 are mounted as shown on the body 44. The interdigital structure 42 may be assumed to be the input converter and the interdigital structure 43 may be assumed to be the output converter although these, of course, can be interchanged if desired. In addition, in the resonator of FIG. 4 only one interdigital structure as 42 or 43 can comprise both the input and output converter. This depends upon the peripheral connecting circuit of the resonator.

The digital structures 41 and 141 illustrated are in FIG. 4 in a manner which is known according to the prior art as reflector pairs which limit an acoustic resonator for the acoustic waves indicated by the wavy line 15 of the resonant filter. Between the two individual digital structures 41 and 141, a standing acoustic wave will occur which is indicated by the double arrow 46. The wave length of the standing wave in the resonator, that is the wave length corresponding to the resonant frequency of the resonator is determined by the dimensions of the periodicity of the digit strips of the two reflector structures 41 and 141 and the spacings of the interdigital structures 41 and 141 from each other. The spacing together with the measurement of the reflection characteristic of the two structures 41 and 141 determine the figure of merit or quality or Q-factor of the passive resonator cavity formed from the structures 41 and 141. The reciprocal of this Q-factor determines the relative bandwidth of the amplitudce characteristic $F_2$ which is formed from the two digital structures 41 and 141. Essentially because of the spacing of the digital structures 41 and 141 which form the reflectors generally the reflector pair 41 and 141 comprise the structure with the narrower band amplitude characteristic $F_2$ and phase characteristic of the resonator. In other words, in the case of the filter according to the invention as a resonator, the two digital structures 41 and 141 taken together form a single digital structure consisting of in each case a number of digital strips. The structures 41 and 141 which form reflectors do not require electrical connection. Thus, they can be designed merely as metal strips which are applied to the surface of the substrate body 44 and they also can be formed with corresponding strip-shaped surface indentations or, respectively, grooves in the substrate body or stripped shaped rails formed above the surface of the substrate body.

The amplitude characteristic $F_2$ of the reflector pair 41 and 141 will have a mean frequency of $f_2$. The reflector pair 41 and 141 correspond to the narrower band digital structure 13 illustrated in FIG. 1. As in the case of the transit time delay line illustrated in FIG. 1, the amplitude characteristic $F_2$ and its mean frequency $f_2$ determine the bandwidth $F_0$ and the mean frequency $f_0$ of the total resonator according to FIG. 4 because the smaller band width which is smaller by a factor of at least 2 or preferably 5 relative to the input and/or output converters 42 and 43.

In the invention, the following equation results:

$$f_1 = \frac{f_0}{1 \pm \frac{1}{2N_1 - 1}}$$

where $f_0$ is the known mean frequency of the filter and $f_1$ is the mean frequency which is to be selected according to the invention for the wider band digital structure. The total length l measure in the direction of the wave propagation direction 16 and 46 of the wider band digital structure 12 in FIG. 1 or in the case of the example of the resonator shown in FIG. 4 of the two structures 42 and 43 taken together is considered. In the example of FIG. 4, the total length l comprises the distance from the left side of the first digital strip of the structure 42 to the last digit at the right side of the structure 43 since the structures 42 and 43 together function as a single structure for the interdigital reflections of the interfacing signal $F_R$ which is to be eliminated. It is to be noted that the space between the structures 42 and 43 is not filled with digital strips completely. For this measurement of l, the factor $N_1$ of the acoustic wave lengths of the surface wave which fit into the length dimension and in each case must be utilized. Thus, $N_1 \times \lambda = l$ as stated above and shown in FIG. 4. In the denominator wherein the plus and minus signs are used, depends on whether the case is $f_{R1}$ to $f_2$ and of the situation of $f_{R2}$ to $f_2$.

In the present invention, the interfering signals occurring due to interdigital reflections are eliminated. In a filter constructed accorded to the invention, the interfering signals from undesired reflections of acoustic waves passing to the left or right sides of the substrate body in each case can occur. So as to prevent such reflections from the ends of the substrate, it is desirable to cut the ends of the substrate bodies 14 and 44, respectively, on lines which are other than 90° relative to the direction of the arrow 15. This is not customary practice for resonator such as illustrated in FIG. 4 thus in the invention forming a resonator with tapered ends as shown in FIG. 4 substantially reduces end reflections.

Although the invention has been described with respect to preferred embodiments, it is not to be so limited as changes and modifications can be made which are within the full intended scope of the invention as defined by the appended claims.

We claim as our invention:

1. A piezoelectric substrate, a first interdigital structure (12) formed on a first surface of said substrate, having a mean frequency of $f_1$ and frequency band width of $F_1$, a second interdigital structure formed on a first surface of said substrate and longitudinally offset from said first interdigital structure and having a mean frequency of $f_2$ and a frequency band width $F_2$ which is narrower than the frequency band width of $F_1$ of said first interdigital structure, said mean frequency $f_2$ of said second interdigital structure offset by a frequency displacement $\Delta f$ from the mean frequency of said first interdigital structure so that the amplitude characteristic $F_2$ of said second interdigital structure has a mean frequency $f_2$ which occurs at one half the distance from $f_1$ to a zero of the amplitude characteristic of $F_1$.

2. A wave filter according to claim 1, characterized in that the amplitude response ($F_1$) of the wide band digital structure (12; 42, 43) has a frequency bandwidth which is at least 5 times the frequency response ($F_2$) of the narrower band digital structure (13; 41 and 141).

3. A wave filter formed as a delay line according to claim 1, characterized in that the one said first and second digital structures (12 or 13) is the input transducer and the other digital structures (13 or 12) is the output transducer and whereby both structures are interdigital structures.

4. A wave filter according to claim 3 characterized in that said second interdigital structure is filled at least to a large extent with digital strips (17).

5. A wave filter as resonator according to claim 1 characterized in that said first interdigital transducer is an input and/or an output transducer, and said second digital structure is a reflector pair (41, 141) with a number of digital strips, and whereby the band width of the narrow band amplitude response ($F_2$) of the reflector pair (41, 141) is determined by the spacing of said first reflectors from each other.

6. A wave filter according to claim 5, characterized in that the digital structures (42, 43) of the input transducer and for the output transducer have essentially the same structure.

7. A wave filter according to claim 5, characterized in that as the output transducer and as the input transducer, comprise said first interdigital transducer (42 or 43).

8. A filter according to claim 1 wherein the frequency shift $\Delta f$ equals one half of the difference of the two frequencies of the zeros $f_{R1}$, $f_{R2}$ $$\Delta f = \tfrac{1}{2}(f_{R2} - f_{R1}).$$

9. A wave filter comprising, a piezoelectric substrate, a first interdigital structure (11) formed on said substrate and having a relatively wider frequency bandpass response ($F_1$), a second interdigital structure formed on said substrate and having a relatively narrow frequency bandpass response ($F_2$), and the center frequency $f_2$ of ($F_2$) which is shifted $\Delta f$ from the center frequency $f_1$ of $F_1$ but still falls in the response $F_1$, so that reflections which cause distortions are eliminated.

10. A filter according to claim 9 wherein the frequency shift $\Delta f$ equals one half of the difference of the two frequencies of the zeros $f_{R1}$, $f_{R2}$ $$\Delta f = \tfrac{1}{2}(f_{R2} - f_{R1}).$$

11. A wave filter with a center frequency $f_0$ comprising, a piezoelectric substrate, a first interdigital structure (11) formed on said substrate and having a relatively wider frequency response $F_1$, and a mean frequency $f_1$, a second interdigital structure formed on said substrate and having a relatively narrow frequency response $F_2$, the mean frequency $f_2$ of the narrow frequency response $F_2$ digital structure (13; 41, 141) is shifted by a frequency difference $\Delta f$ from $f_1$ so that one of the two zero locations $f_{R1,R2}$ of the distortion signal $F_R$ next to maximum frequency response $F_R$, falling into the frequency response $F_1$ of the wide band digital structure (12, 42, 43,) said distortion signal $F_R$ being due to interdigital reflections of the wide band $F_1$ digital structure (12; 42, 43) and said zeros ($f_{R1}$, $f_{R2}$) being dependent on the position of the center frequency $f_1$ of the wide band digital structure (12; 42, 43,) which has a frequency close to the predetermined center frequency $f_0$ of the filter so that the interdigital reflections $F_R$ which cause interference are eliminated.

12. A filter according to claim 11 wherein the frequency shift $\Delta f$ equals one half of the difference of the two frequencies of the zeros $f_{R1}$, $f_{R2}$ $$\Delta f = \tfrac{1}{2}(f_{R2} - f_{R1}).$$

* * * * *